(12) United States Patent
Mou et al.

(10) Patent No.: US 11,719,232 B2
(45) Date of Patent: Aug. 8, 2023

(54) DRIVING SYSTEM FOR DRIVING PIEZOELECTRIC PUMP

(71) Applicant: MICROJET TECHNOLOGY CO., LTD., Hsinchu (TW)

(72) Inventors: Hao-Jan Mou, Hsinchu (TW);
Shih-Chang Chen, Hsinchu (TW);
Che-Wei Huang, Hsinchu (TW);
Chun-Hung Liao, Hsinchu (TW);
Wei-Chuan Liao, Hsinchu (TW);
Chi-Feng Huang, Hsinchu (TW);
Yung-Lung Han, Hsinchu (TW);
Tsung-I Lin, Hsinchu (TW); Chin-Wen Hsieh, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 192 days.

(21) Appl. No.: 17/301,951

(22) Filed: Apr. 20, 2021

(65) Prior Publication Data
US 2021/0332811 A1 Oct. 28, 2021

(30) Foreign Application Priority Data

Apr. 24, 2020 (TW) .................. 109113909

(51) Int. Cl.
*F04B 43/04* (2006.01)
*H10N 30/80* (2023.01)
(52) U.S. Cl.
CPC ......... *F04B 43/046* (2013.01); *H10N 30/802* (2023.02)

(58) Field of Classification Search
CPC ....... H01L 41/042; H01L 41/04; H01L 41/09; F04B 43/046; H10N 30/802
See application file for complete search history.

(56) References Cited

U.S. PATENT DOCUMENTS

| 2009/0015097 A1* | 1/2009 | Meng ..................... H02N 2/14 318/116 |
| 2018/0106245 A1* | 4/2018 | Chen ..................... F04B 43/046 |
| 2020/0355178 A1* | 11/2020 | Okaguchi ............. F04B 45/047 |

* cited by examiner

*Primary Examiner* — Kenneth J Hansen
(74) *Attorney, Agent, or Firm* — McClure, Qualey & Rodack, LLP

(57) ABSTRACT

A driving system for driving piezoelectric pump includes one or more mechanical devices and a driving circuit system electrically connected to the at least one mechanical device. The driving circuit system includes a pump-driving unit, a linear voltage-stabilizing unit, a microcontroller unit, a current-sensing unit, and a connection unit. The microcontroller unit generates a first signal, a second signal, and a third signal, and the pump-driving unit receives these signals to drive the mechanical device. The current-sensing unit receives a fourth signal transmitted by the pump-driving unit to obtain an actuation current value of the mechanical device. The linear voltage-stabilizing unit, the current-sensing unit, and the microcontroller unit are coupled to each other through a fifth signal and a sixth signal. The connection unit and the microcontroller unit are coupled to each other through a reset signal, a seventh signal, and an eighth signal provided by the microcontroller unit.

8 Claims, 4 Drawing Sheets

DRIVING SYSTEM FOR DRIVING PIEZOELECTRIC PUMP

CROSS-REFERENCE TO RELATED APPLICATION

This non-provisional application claims priority under 35 U.S.C. § 119(a) to Patent Application No. 109113909 filed in Taiwan, R.O.C. on Apr. 24, 2020, the entire contents of which are hereby incorporated by reference.

BACKGROUND

Technical Field

The present disclosure relates to a driving circuit system, in particular, to a driving circuit system adapted to drive piezoelectric pump.

Related Art

Presently, different products in various fields such as pharmaceutical industries, computer techniques, printing industries, or energy industries are developed toward elaboration and miniaturization. In this regard, the micro fluid actuators included in the micro pumps become the crucial components.

With the rapid developments of technology, the application of fluid transport devices become more and more diversified, and can be seen in the applications of industrial, biomedical, medical cares, electronic heat dissipation devices, etc., and even in wearable devices, which has attracted a lot of attention recently. Thus, it can be understood that there is a trend that the sizes of traditional gas transportation devices have gradually become smaller and the fluid transporting capacities of the gas transportation devices have become larger.

A variety of micro fluid actuators have been developed. However, how to effectively reduce the volume of the voltage conversion circuit board in the micro fluid actuator is still an important direction of development.

SUMMARY

One object of the present disclosure is providing a driving system for driving piezoelectric pump. Using a miniaturized micro fluid actuator can effectively reduce the volume of the pump, and the flow rate of the pump can be controlled more accurately.

To achieve the above mentioned purpose(s), a general embodiment of the present disclosure provides a driving system for driving piezoelectric pump. The driving system includes at least one mechanical device and a driving circuit system electrically connected to the at least one mechanical device. The driving circuit system includes a pump-driving unit, a linear voltage-stabilizing unit, a microcontroller unit, a current-sensing unit, and a connection unit. The pump-driving unit receives a first signal, a second signal, and a third signal that are transmitted by the microcontroller unit, and drives the at least one mechanical device to operate. The current-sensing unit receives a fourth signal transmitted by the pump-driving unit so as to obtain an actuation current value of the at least one mechanical device. The linear voltage-stabilizing unit is a high frequency voltage-stabilizing element. The linear voltage-stabilizing unit, the current sensor unit, and the microcontroller unit are coupled to each other through a fifth signal and a sixth signal. The microcontroller unit generates the first signal, the second signal, and the third signal by executing a program. The connection unit provides a reset signal, a seventh signal, an eighth signal, a 5V power supply, and a ground terminal. The connection unit and the microcontroller unit are coupled to each other through the reset signal, the seventh signal, and the eighth signal.

BRIEF DESCRIPTION OF THE DRAWINGS

The disclosure will become more fully understood from the detailed description given herein below for illustration only, and thus not limitative of the disclosure, wherein.

DETAILED DESCRIPTION

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Figure 1:
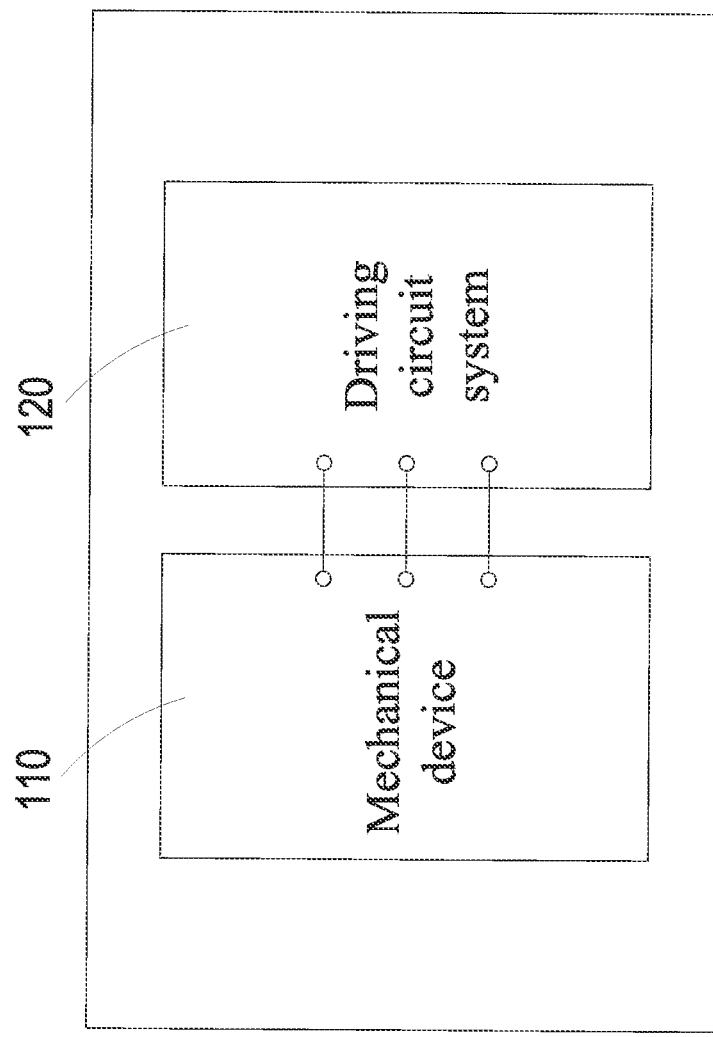
FIG. 1 illustrates a system structure diagram of a driving system for driving piezoelectric pump according to an exemplary embodiment of the present disclosure.

Referred to FIG. 1, a driving system for driving piezoelectric pump according to some embodiments of the present disclosure is disclosed. In an exemplary embodiment, the driving system for driving piezoelectric pump 10 includes at least one mechanism device 110 and a driving circuit system 120. The driving circuit system 120 is electrically connected to the at least one mechanism device 110. The driving circuit system 120 outputs a pulsed power signal and provides actuation energy to the at least one mechanism device 110. The pulse power signal includes such as the duty cycle, the peak-to-peak voltage (VPP), and the output switching frequency of the output voltage of the driving circuit system 120.

It is noted that, in some embodiments of the present disclosure, the number of the mechanical devices 110 may be one, but not limited thereto. In some other embodiments, a plurality of the mechanical devices 110 may be connected with each other in series, in parallel, in series and parallel, or in an array.

Figure 2A:
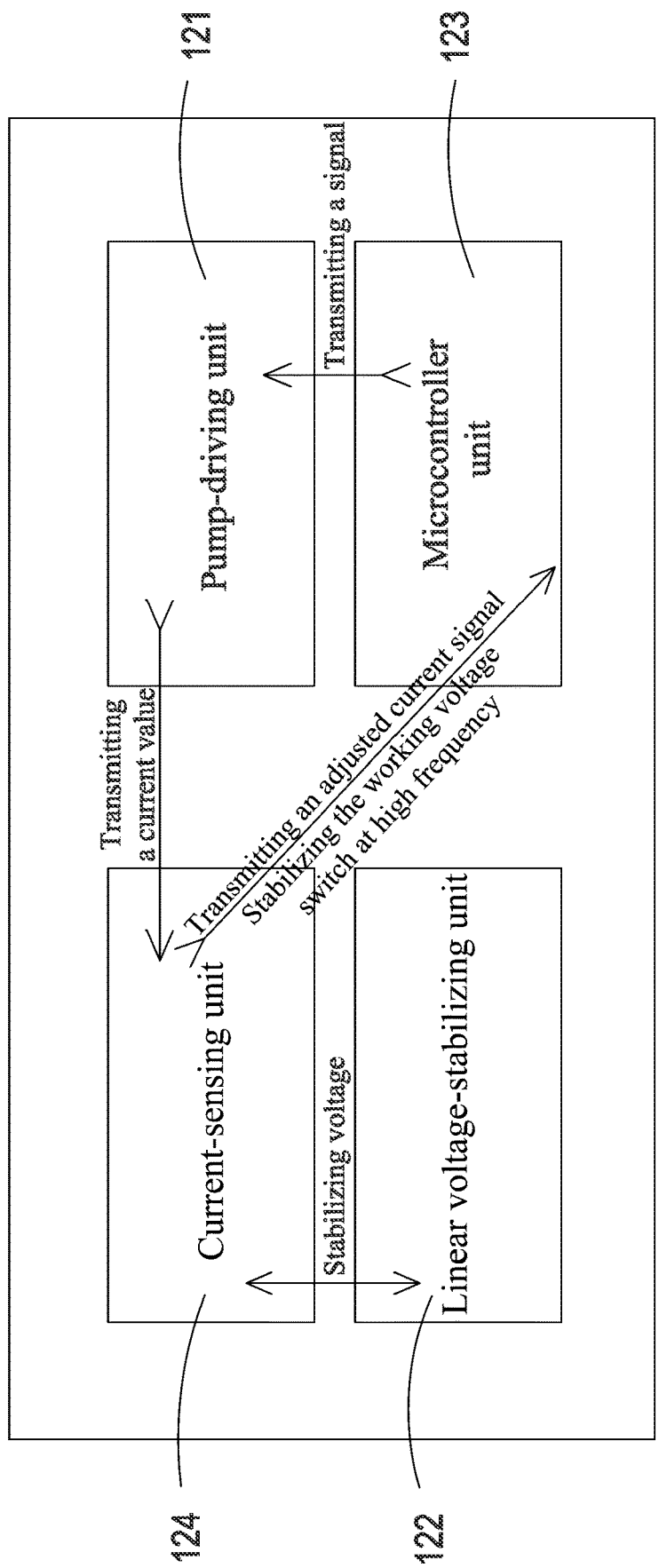
FIG. 2A illustrates a block diagram showing the operation relationship of the driving system for driving piezoelectric pump according to the exemplary embodiment of the present disclosure.
Figure 2B:
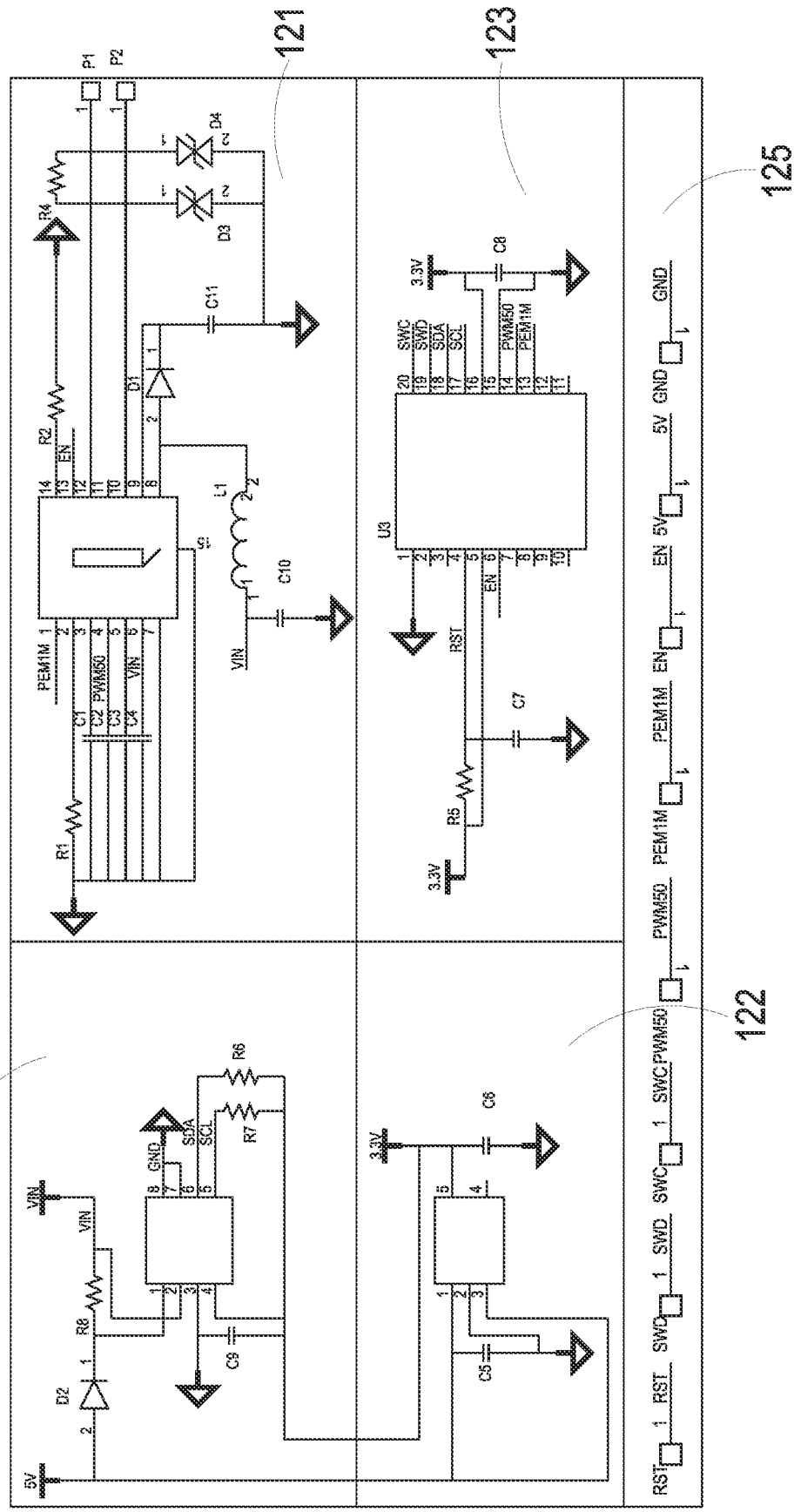
FIG. 2B illustrates a circuit diagram of the driving system for driving piezoelectric pump according to the exemplary embodiment of the present disclosure.

Please refer to FIG. 2A and FIG. 2B. In this embodiment, the driving circuit 120 includes a pump-driving unit 121, a linear voltage-stabilizing unit 122, a microcontroller unit 123, a current-sensing unit 124, and a connection unit 125.

The pump-driving unit 121 receives a first signal (EN), a second signal (PEM1M), and a third signal (PWM50) which are transmitted by the microcontroller unit 123, and the pump-driving unit 121 drives the at least one mechanical device 110 to operate. The first signal (EN) is a start signal for controlling the pump-driving unit 121. If the pump-driving unit 121 receives the first signal (EN) transmitted by the microcontroller unit 123, then the pump drive unit 121 starts to operate. If the pump-driving unit 121 does not receive the first signal (EN) transmitted by the microcontroller unit 123, then the pump drive unit 121 will not start. The second signal (PEM1M) affects and controls the amplitude of the output voltage provided to the at least one mechanical device 110 by the pump-driving unit 121. The third signal (PWM50) affects and controls the switching frequency of the output voltage provided to the at least one mechanical device 110 by the pump-driving unit 121.

The current-sensing unit 124 receives a forth signal (VIN) transmitted by the pump-driving unit 121 so as to obtain an actuation current value (VIN) of the at least one mechanical device 110. When the mechanical device 110 operates, the mechanical device 110 triggers the current-sensing unit 124 to operate through the fourth signal (VIN) (i.e. the actuation current value of the mechanical device 110) transmitted by the pump-driving unit 121. When the current-sensing unit 124 operates, the current-sensing unit 124 transmits a fifth signal (SDA) and a sixth signal (SCL) synchronously to the linear voltage-stabilizing unit 122 and the microcontroller unit 123.

The linear voltage-stabilizing unit 122 is a high frequency voltage-stabilizing element. The linear voltage-stabilizing unit 122, the current-sensing unit 124, and the microcontroller unit 123 are coupled to each other through a fifth signal (SDA) and a sixth signal (SCL). Since the mechanical device 110 is operated under high frequency voltage switching, the fifth signal (SDA) and the sixth signal (SCL) are synchronously transmitted to the microcontroller unit 123 through the coupling between the linear voltage-stabilizing unit 122 and the current-sensing unit 124, so that the microcontroller unit 123 has the feedback signal-controlling function.

The microcontroller unit 123 executes a program to generate the first signal (EN), the second signal (PEM1M), and the third signal (PWM50). When the microcontroller unit 123 executes the program, the microcontroller unit 123 constantly generates an adjusted first signal (EN), an adjusted second signal (PEM1M), and an adjusted third signal (PWM50) through the program based on the feedback signal of the fifth signal (SDA) and the feedback signal of the sixth signal (SCL). The program then sends the adjusted first signal (EN), the adjusted second signal (PEM1M), and the adjusted third signal (PWM50) to the pump-driving unit 121. Therefore, the output voltage amplitude and output voltage switching frequency of the pump-driving unit 121 can be automatically adjusted, and the actuation current can be detected constantly so as to be fed back to the microcontroller unit 123 for automatically optimizing the output power, so that the mechanical device 110 can be maintained at an optimized fluid transmission efficiency.

The connection unit 125 can provide a reset signal (RST), a seventh signal (SWD), an eighth signal (SWC), a 5V power supply, and a ground terminal (GND). The connection unit 125 and the microcontroller unit 123 are coupled to each other through the reset signal (RST), the seventh signal (SWD), and the eighth signal (SWC). The reset signal (RST) can reset the microcontroller unit 123. The seventh signal (SWD) and the eighth signal (SWC) are used to manually adjust the microcontroller unit 123 to change the output voltage (VPP) of the microcontroller unit 123. The seventh signal (SWD) and the eighth signal (SWC) can change the input voltage value (DCA) and the duty cycle (Duty) of the microcontroller unit 123. The relationship between the input voltage value (DCA), the duty cycle (Duty), and the output voltage (VPP) can be referred to Table 1.

TABLE 1

| | DCA(V) | | | | | | | | | | | | | |
|---|---|---|---|---|---|---|---|---|---|---|---|---|---|---|
| | 0 | 0.1 | 0.2 | 0.3 | 0.4 | 0.5 | 0.6 | 0.7 | 0.8 | 0.9 | 1.0 | 1.1 | 1.2 | 1.3 |
| Vpp (V) | 0 | 0 | 0 | 0 | 114 | 134 | 170 | 204 | 228 | 252 | 260 | 280 | 286 | 300 |
| | Duty (%) | | | | | | | | | | | | | |
| | 0 | 10 | 20 | 30 | 40 | 50 | 60 | 70 | 80 | 90 | 100 | | | |
| Vpp(V) | 0 | 0 | 108 | 138 | 166 | 192 | 218 | 246 | 270 | 280 | 300 | | | |

The table above presents the results obtained through experiments. Moreover, it can be understood that the input voltage value (DCA) of the microcontroller unit 123 is between 0 V and 1.3 V, and the duty cycle (Duty) is between 0% and 100%. The output voltage (VPP) of the microcontroller unit 123 can be changed by adjusting the input voltage value (DCA) or the duty cycle (Duty).

Since the microcontroller unit 123 controls the actuation time of the first signal (EN) by executing the program, the actuation time of the mechanical device 110 can be accurately controlled, thereby achieving accurate control of the output flow rate of the mechanism device 110. For example, the micro-controller unit 123 may generate the first signal (EN) in a form of pulse signal with an interval of 50 ms, and allow the mechanical device 110 to deliver 1 unit of the fluid per 50 ms. As a result, through adjusting the actuation time of the first signal (EN) through the program, the microcontroller unit 123 can generate a pulse signal with an interval of 10 ms as the first signal (EN), and the mechanical device 110 may deliver 0.2 unit of the fluid per 10 ms.

Figure 3:
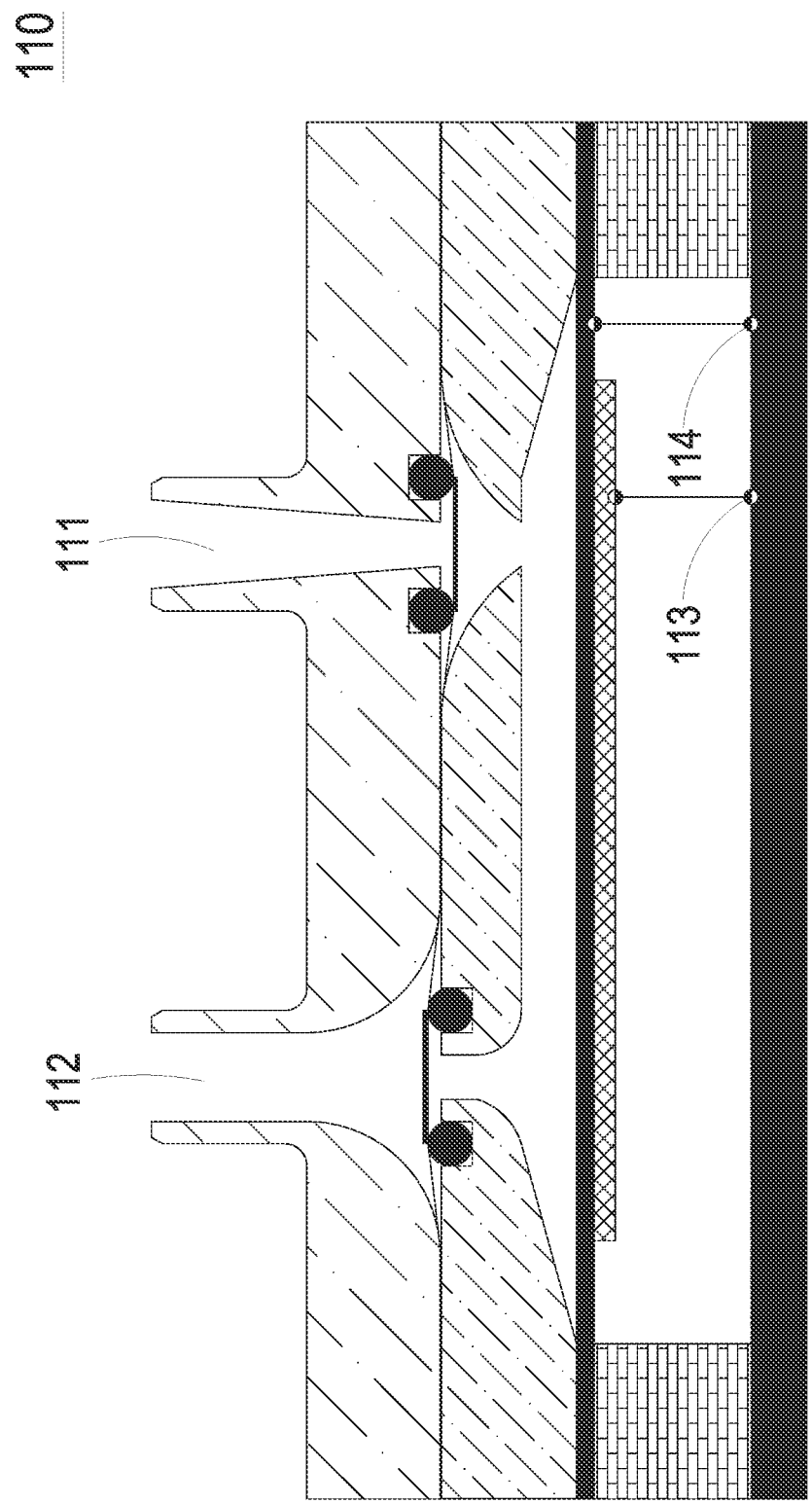
FIG. 3 illustrates a schematic cross-sectional view of a mechanical device of the driving system for driving piezoelectric pump according to the exemplary embodiment of the present disclosure.

Please refer to FIG. 3. In the present embodiment, the mechanical device 110 is a piezoelectric pump. The mechanical device 110 has an inlet hole 111, an outlet hole 112, a first input voltage 113, and a second input voltage 114. The inlet hole 111 provides the fluid to flow in, and the outlet hole 112 provides the fluid transported by the mechanical device 110 to flow out. The fluid may be liquid or gas. The first input voltage 113 and the second input voltage 114 respectively electrically connected to the contact P1 and the contact P2 of the pump-driving unit 121, so that the mechanical device 110 can be driven through the driving circuit system 120.

To sum up, the present disclosure provides a driving system for driving piezoelectric. By using a pump-driving unit, a linear voltage-stabilizing unit, a microcontroller unit, and a current-sensing unit, the driving circuit system can constantly detect the actuation current and feed the actuation current value back to the microcontroller unit, so that the microcontroller unit can automatically optimize the output power constantly. Thus, the mechanical device can be maintained at an optimized fluid transmission efficiency. Moreover, in some embodiments, the actuation time of the mechanical device can be accurately controlled as well, thereby achieving accurate control of the output flow rate. Further, the miniaturized fluid actuator can effectively reduce the total volume of the device.

The foregoing outlines features of several embodiments so that those skilled in the art may better understand the aspects of the present disclosure. Those skilled in the art should appreciate that they may readily use the present disclosure as a basis for designing or modifying other processes and/or structures for achieving out the same purposes and/or obtaining the same advantages of the embodiments disclosed herein. Those skilled in the art should also realize that these equivalent constructions would not depart from the spirit and scope of the present disclosure, and that they may make various changes, substitutions, and alterations herein without departing from the spirit and scope of the present disclosure.

What is claimed is:

1. A driving system for driving a piezoelectric pump device, comprising:
   at least one mechanical device; and
   a driving circuit system electrically connected to the at least one mechanical device, wherein the driving circuit system comprises a pump-driving unit, a linear voltage-stabilizing unit, a microcontroller unit, a current-sensing unit, and a connection unit;
   wherein the pump-driving unit receives a first signal, a second signal, and a third signal that are transmitted by the microcontroller unit, and drives the at least one mechanical device to operate;
   wherein the current-sensing unit receives a fourth signal transmitted by the pump-driving unit so as to obtain an actuation current value of the at least one mechanical device;
   wherein the linear voltage-stabilizing unit is a voltage-stabilizing element, wherein the linear voltage-stabilizing unit, the current-sensing unit, and the microcontroller unit are coupled to each other through a fifth signal and a sixth signal;
   wherein the microcontroller unit executes a program to generate the first signal, the second signal, and the third signal; and
   wherein the connection unit provides a reset signal, a seventh signal, an eighth signal, a 5V power supply, and a ground terminal, wherein the connection unit and the microcontroller unit are coupled to each other through the reset signal, the seventh signal, and the eighth signal.

2. The driving system for driving the piezoelectric pump device according to claim 1, wherein the at least one mechanical device is a piezoelectric pump.

3. The driving system for driving the piezoelectric pump device according to claim 2, wherein the piezoelectric pump has an inlet hole, an outlet hole, a first input voltage, and a second input voltage.

4. The driving system for driving the piezoelectric pump device according to claim 3, wherein the first input voltage and the second input voltage respectively electrically connected to two contacts of the pump-driving unit.

5. The driving system for driving the piezoelectric pump device according to claim 1, wherein when the microcontroller unit executes the program, the microcontroller unit generates an adjusted first signal, an adjusted second signal, and an adjusted third signal based on feedback signals of the fifth signal and the sixth signal through the program, and then the program sends the adjusted first signal, the adjusted second signal, and the adjusted third signal to the pump-driving unit.

6. The driving system for driving the piezoelectric pump device according to claim 1, wherein the first signal is a start signal for controlling the pump-driving unit.

7. The driving system for driving the piezoelectric pump device according to claim 1, wherein the second signal affects and controls an amplitude of an output voltage provided by the pump-driving unit to the at least one mechanical device.

8. The driving system for driving the piezoelectric pump device according to claim 1, wherein the second signal affects and controls a switching frequency of an output voltage provided by the pump-driving unit to the at least one mechanical device.

\* \* \* \* \*